(12) United States Patent
Almeida et al.

(10) Patent No.: US 11,835,655 B2
(45) Date of Patent: Dec. 5, 2023

(54) MEMS MIRROR ASSEMBLIES WITH PIEZOELECTRIC ACTUATORS

(71) Applicant: BEIJING VOYAGER TECHNOLOGY CO., LTD., Beijing (CN)

(72) Inventors: Sergio Almeida, Mountain View, CA (US); Yufeng Wang, Mountain View, CA (US); Sae Won Lee, Mountain View, CA (US); Youmin Wang, Mountain View, CA (US)

(73) Assignee: BEIJING VOYAGER TECHNOLOGY CO., LTD., Beijing (CN)

(*) Notice: Subject to any disclaimer, the term of this patent is extended or adjusted under 35 U.S.C. 154(b) by 616 days.

(21) Appl. No.: 16/994,290

(22) Filed: Aug. 14, 2020

(65) Prior Publication Data
US 2022/0050182 A1 Feb. 17, 2022

(51) Int. Cl.
*G01S 7/481* (2006.01)
*H10N 30/20* (2023.01)
*H10N 30/88* (2023.01)
*G01S 17/931* (2020.01)

(52) U.S. Cl.
CPC .......... *G01S 7/4817* (2013.01); *G01S 7/4814* (2013.01); *G01S 17/931* (2020.01); *H10N 30/20* (2023.02); *H10N 30/88* (2023.02)

(58) Field of Classification Search
CPC .... G01S 7/4817; G01S 17/931; G01S 7/4814; H10N 30/20; H10N 30/88
See application file for complete search history.

(56) References Cited

U.S. PATENT DOCUMENTS

| | | | |
|---|---|---|---|
| 2012/0236379 A1* | 9/2012 | da Silva | G02B 26/0841 359/200.8 |
| 2018/0059406 A1* | 3/2018 | Torkkeli | G02B 26/101 |
| 2021/0041687 A1* | 2/2021 | Yokota | H04N 9/3129 |

* cited by examiner

*Primary Examiner* — Isam A Alsomiri
*Assistant Examiner* — Joseph C Fritchman
(74) *Attorney, Agent, or Firm* — BAYES PLLC

(57) ABSTRACT

Embodiments of the disclosure provide a mirror assembly for controlling optical directions in an optical sensing system. The mirror assembly may include a frame and a beam structure mechanically coupled to the frame. The beam structure may define a rotational axis. The mirror assembly may also include a micro mirror suspended by the beam structure. The mirror assembly may further include a plurality of piezoelectric actuators mechanically coupled to the frame and configured to rotate the micro mirror along the rotational axis. Each of the plurality of piezoelectric actuators may be disposed between the rotational axis and an outer edge of the frame.

18 Claims, 6 Drawing Sheets

MEMS MIRROR ASSEMBLIES WITH PIEZOELECTRIC ACTUATORS

TECHNICAL FIELD

The present disclosure relates to optical sensing systems such as a light detection and ranging (LiDAR) system, and more particularly to, a mirror assembly for controlling optical directions in such an optical sensing system.

BACKGROUND

Optical sensing systems such as LiDAR systems have been widely used in autonomous driving and/or for producing high-definition maps. For example, a typical LiDAR system measures the distance to a target by illuminating the target with pulsed laser light beams and measuring the reflected pulses with a sensor such as a photodetector or a photodetector array. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

The pulsed laser light beams emitted by a LiDAR system are typically directed to multiple directions to cover a field of view (FOV). Various methods can be used to control the directions of the pulsed laser light beams. Existing LiDAR systems generally use electrostatic-, piezoelectric-, or magnetic-based actuators (e.g., electrostatic actuators, piezoelectric actuators, magnetic actuators, etc.) to drive an optical component, such as a mirror, in the LiDAR systems to direct the pulsed laser light beams to the surrounding environment when the mirror is oscillating back and forth. However, actuators in existing LiDAR systems suffer from lower torque, leading to small oscillating angles.

Embodiments of the disclosure enhance the oscillating angles by providing a mirror assembly with stacked piezoelectric actuators.

SUMMARY

Embodiments of the disclosure provide a mirror assembly for controlling optical directions in an optical sensing system. The mirror assembly may include a frame and a beam structure mechanically coupled to the frame. The beam structure may define a rotational axis. The mirror assembly may also include a micro mirror suspended by the beam structure. The mirror assembly may further include a plurality of piezoelectric actuators mechanically coupled to the frame and configured to rotate the micro mirror along the rotational axis. Each of the plurality of piezoelectric actuators may be disposed between the rotational axis and an outer edge of the frame.

Embodiments of the disclosure also provide a method for controlling a mirror assembly in an optical sensing system. The method may include receiving, by a micro mirror of the mirror assembly, an optical beam emitted from an optical source. The micro mirror may be suspended by a beam structure mechanically coupled to a frame of the mirror assembly. The method may also include rotating, by a plurality of piezoelectric actuators mechanically coupled to the frame, the micro mirror along a rotational axis defined by the beam structure to change a direction of the optical beam. Each of the plurality of piezoelectric actuators may be disposed between the rotational axis and an outer edge of the frame.

Embodiments of the disclosure further provide an optical sensing system. The optical sensing system may include an optical source configured to emit an optical beam to scan an environment around the optical sensing system. The optical sensing system may also include a mirror assembly configured to control a direction of the optical beam. The mirror assembly may include a frame and a beam structure mechanically coupled to the frame. The beam structure may define a rotational axis. The mirror assembly may also include a micro mirror suspended by the beam structure. The mirror assembly may further include a plurality of piezoelectric actuators mechanically coupled to the frame and configured to rotate the micro mirror along the rotational axis. Each of the plurality of piezoelectric actuators may be disposed between the rotational axis and an outer edge of the frame.

It is to be understood that both the foregoing general description and the following detailed description are exemplary and explanatory only and are not restrictive of the invention, as claimed.

DETAILED DESCRIPTION

Figure 1:
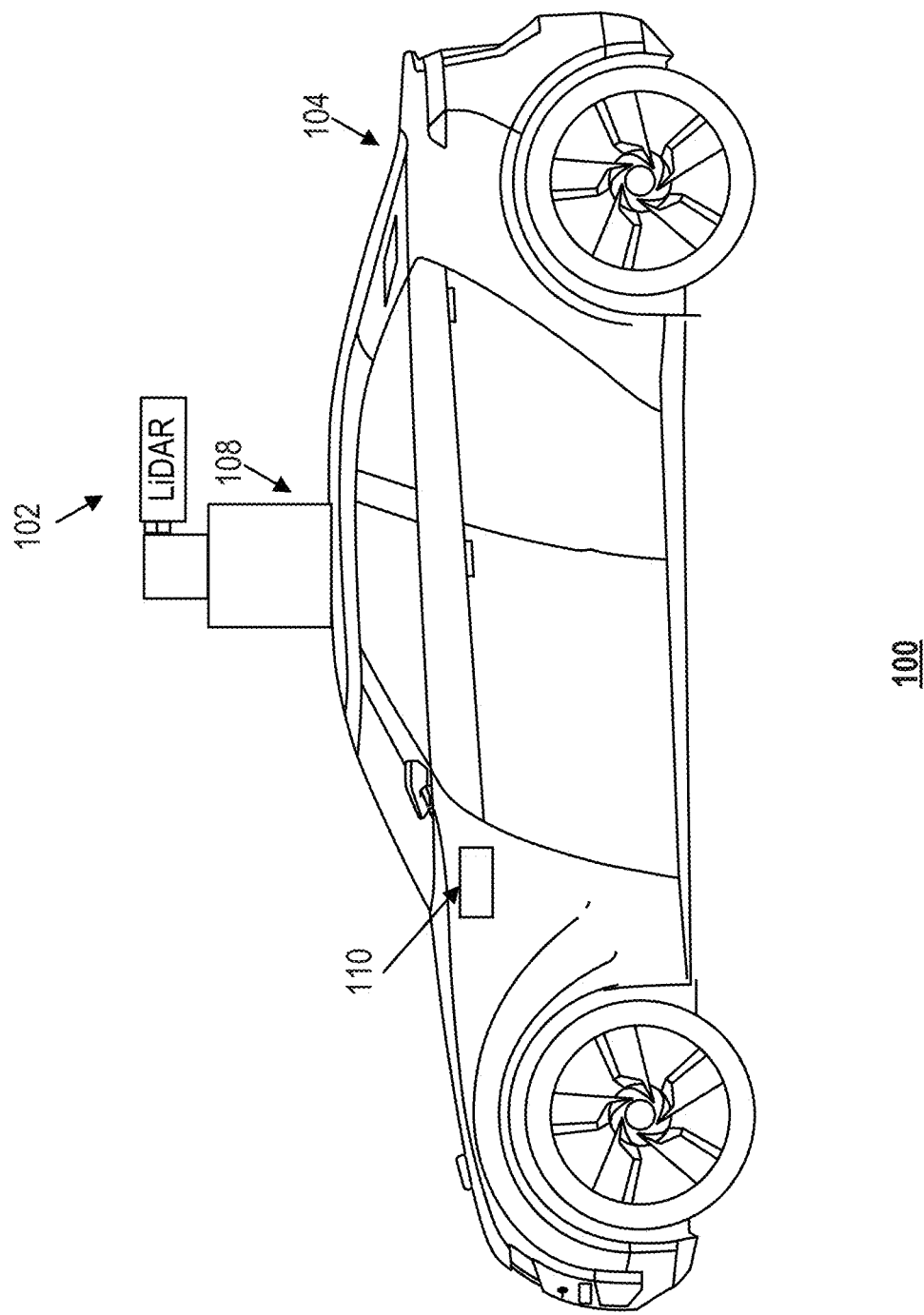
FIG. 1 illustrates a schematic diagram of an exemplary vehicle equipped with a LiDAR system, according to embodiments of the disclosure.

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide systems and methods for controlling optical directions in an optical sensing system (e.g., a LiDAR system) using a mirror assembly. The mirror assembly may include a mirror configured to direct an optical beam into a plurality of directions to facilitate scanning of an environment around the optical sensing system. For example, the mirror can be driven by at least one actuator to tilt certain angles along an axis, thereby directing (e.g., guiding, reflecting, refracting, inflecting, deflecting, and/or diffracting) incident optical beams from an optical source (e.g., a laser source) toward multiple directions to, for example, scan the environment around the optical sensing system. The mirror can be implemented using a single micro mirror or an array of micro mirrors. In some embodiments, the mirror assembly can be made from semiconductor materials using microelectromechanical system (MEMS) technologies. Such a mirror assembly can also be referred to as a micromachined mirror assembly or a MEMS mirror assembly.

A mirror in a micromachined mirror assembly can be driven by one or more piezoelectric actuators that are mechanically coupled to a substrate or a frame over which the mirror is suspended by one or more beams. As used herein, a frame may include part of a substrate that have certain structural features, such as arms, ridges, trenches, openings enclosed by boundary structures, etc. In some embodiments, a piezoelectric actuator may deform (e.g., contract or expand) when an electrical signal is applied thereon. The deformation of the piezoelectric actuators may cause deformation of a substrate or frame, which in turn cause rotation (e.g., tilting) of the mirror through the beams. The electrical signal applied to the piezoelectric actuator may be an alternate current (AC) signal having a frequency of $f_d$. When $f_d$ matches the resonant frequency of the mirror, the mirror can oscillate at the resonant frequency and reach a certain oscillation angle (e.g., a maximal angle the mirror can reach before tilting back), thereby directing incident optical beams into multiple directions (e.g., scanning).

Compared to electrostatic actuators, which generate an electrical driving force pulling or attracting the mirror through a comb structure at an edge of the mirror, piezoelectric actuators can generate much larger driving force. Therefore, in applications where large mirrors are used, or where large oscillation angles are required (e.g., translating to large FOVs), piezoelectric actuators can perform better than electrostatic actuators.

While piezoelectric actuators have certain advantages over electrostatic actuators, current MEMS mirror assemblies utilizing piezoelectric actuators are still far from achieving high efficiency due to various energy losses, among them losses caused by suboptimal placement of piezoelectric actuators. A typical implementation of piezoelectric actuator-driven MEMS mirror assembly has an entire sheet of piezoelectric material placed underneath the substrate or frame of the mirror assembly, causing nearly uniform deformation across the substrate or frame, and only a fraction of the energy is transferred to rotate the mirror.

Embodiments of the present disclosure improve the efficiency of piezoelectric actuators by placing multiple piezoelectric actuators (referred to as "a stack of" piezoelectric actuators or "stacked" piezoelectric actuators) in specific locations to produce maximal torque. For example, pairs of piezoelectric actuators can be disposed symmetrically with respect to the rotational axis and driven by driving signals having opposite polarity. The distance between the piezoelectric actuators and the rotational axis may be set to generate high torque. In this way, energy transfer efficiency can be improved, which leads to larger oscillation angles, which in turn translates to larger FOVs. The performance of an optical sensing system equipped with such an improved mirror assembly can also be improved through a larger angular scanning range. Such an improved optical sensing system can be used in many applications, including, for example, autonomous driving and high-definition map survey, in which the optical sensing system can be equipped on a vehicle.

FIG. 1 illustrates a schematic diagram of an exemplary vehicle 100 equipped with an optical sensing system (e.g., a LiDAR system) 102 (hereinafter also referred to as LiDAR system 102), according to embodiments of the disclosure. Consistent with some embodiments, vehicle 100 may be a survey vehicle configured for acquiring data for constructing a high-definition map, 3-D buildings, and/or, city modeling. Vehicle 100 may also be an autonomous driving vehicle.

As illustrated in FIG. 1, vehicle 100 may be equipped with LiDAR system 102. In some embodiments, LiDAR system 102 may be mounted to a body 104 via a mounting structure 108. Mounting structure 108 may be an electro-mechanical device installed or otherwise attached to body 104 of vehicle 100. Mounting structure 108 may use screws, adhesives, or another mounting mechanism. In some embodiments, LiDAR system 102 may be integrated with vehicle 100 without using mounting structure 108. For example, LiDAR system 102 may be integrated as part of vehicle 100 on the top, side, front, and/or back of vehicle 100. Vehicle 100 may be additionally equipped with a sensor 110 inside or outside body 104 using any suitable mounting mechanisms or integrated as part of vehicle 100. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102, sensor 110, and/or vehicle 100 to achieve desirable 3D sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment. LiDAR system 102 may measure the distance to a target by illuminating the target with optical signals such as pulsed laser beams and measuring the reflected pulses with a receiver. The laser beams used by LiDAR system 102 may be in the ultraviolet, visible, or near infrared frequency range. In some embodiments of the present disclosure, LiDAR system 102 may capture point clouds including depth information of the objects in the surrounding environment. As vehicle 100 moves along the trajectory, LiDAR system 102 may continuously capture data. Each set of scene data captured at a certain time point or range is known as a data frame.

Figure 2:
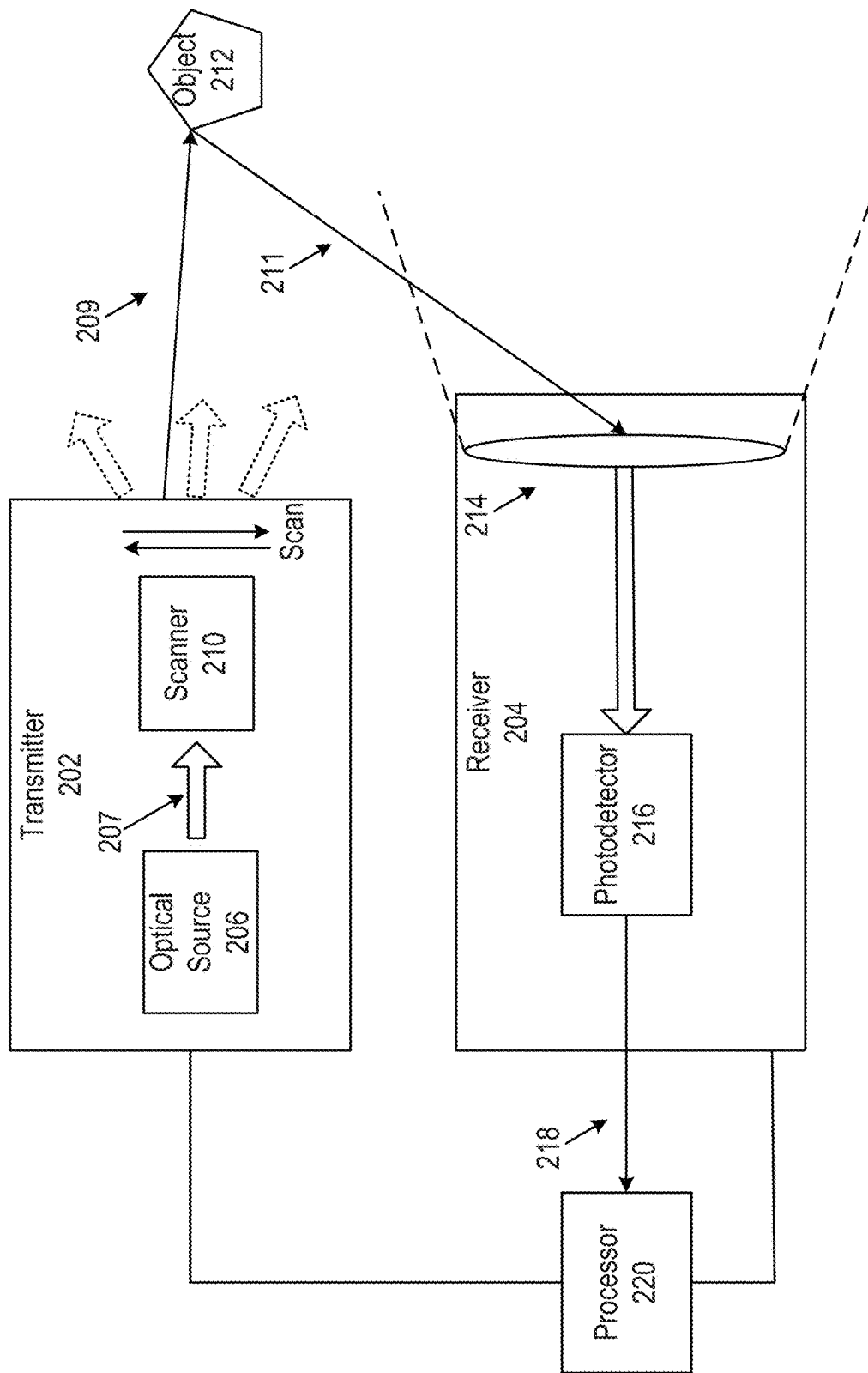
FIG. 2 illustrates a block diagram of an exemplary LiDAR system, according to embodiments of the disclosure.

FIG. 2 illustrates a block diagram of an exemplary implementation of LiDAR system 102, according to embodiments of the disclosure. LiDAR system 102 may include a transmitter 202 and a receiver 204. Transmitter 202 may emit laser beams along multiple directions. Transmitter 202 may include one or more optical sources 206 (e.g., one or more laser sources) and one or more scanners 210. As will be described below in greater detail, scanner 210 may include a micromachined mirror assembly having a mirror driven by one or more actuators.

Transmitter 202 can sequentially emit a stream of pulsed laser beams in different directions within a scan range (e.g., a range in angular degrees), as illustrated in FIG. 2. Optical source 206 may be configured to provide a laser beam 207 (also referred to as a "native laser beam") to scanner 210. In some embodiments of the present disclosure, optical source 206 may generate a pulsed laser beam in the ultraviolet, visible, or near infrared wavelength range.

In some embodiments of the present disclosure, optical source 206 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of laser beam 207 provided by a PLD may be smaller than 1,100 nm, such as 405 nm, between 445 nm and 465 nm, between 510 nm and 525 nm, 532 nm, 635 nm, between 650 nm and 660 nm, 670 nm, 760 nm, 785 nm, 808 nm, or 848 nm. It is understood that any suitable laser source may be used as optical source 206 for emitting laser beam 207.

Scanner 210 may be configured to emit a laser beam 209 to an object 212 in a first direction. Object 212 may be made of a wide range of materials including, for example, non-metallic objects, rocks, rain, chemical compounds, aerosols, clouds and even single molecules. The wavelength of laser beam 209 may vary based on the composition of object 212. In some embodiments, at different time points during the scan, scanner 210 may emit laser beam 209 to object 212 in different directions within a range of scanning angles by tilting the mirror of the micromachined mirror assembly. In some embodiments of the present disclosure, scanner 210 may also include optical components (e.g., lenses, other mirrors) that can focus pulsed laser light into a narrow laser beam to increase the scan resolution and/or the range to scan object 212.

In some embodiments, receiver 204 may be configured to detect a returned laser beam 211 returned from object 212. The returned laser beam 211 may be in a different direction from laser beam 209. Receiver 204 can collect laser beams returned from object 212 and output electrical signals reflecting the intensity of the returned laser beams. Upon contact, laser light can be reflected by object 212 via backscattering, such as Rayleigh scattering, Mie scattering, Raman scattering, and fluorescence. As illustrated in FIG. 2, receiver 204 may include one or more lenses 214 and one or more photodetectors 216. Lens 214 may be configured to collect light from a respective direction in its field of view (FOV). At different time points during the scan, returned laser beam 211 from different directions may be collected by lens 214. Returned laser beam 211 may be returned from object 212 and may have the same wavelength as laser beam 209.

Photodetector 216 may be configured to detect returned laser beam 211 returned from object 212. In some embodiments, photodetector 216 may convert the laser light (e.g., returned laser beam 211) collected by lens 214 into an electrical signal 218 (e.g., a current or a voltage signal). Electrical signal 218 may be generated when photons are absorbed in a photodiode included in photodetector 216. In some embodiments of the present disclosure, photodetector 216 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiPM/MPCC detector array, or the like.

LiDAR system 102 may also include one or more processor 220. Processor 220 may receive electrical signal 218 generated by photodetector 216. Processor 220 may process electrical signal 218 to determine, for example, distance information carried by electrical signal 218. Processor 220 may construct a point cloud based on the processed information. Processor 218 may include a microprocessor, a microcontroller, a central processing unit (CPU), a graphical processing unit (GPU), a digital signal processor (DSP), or other suitable data processing devices. Processor 220 may control the operation of transmitter 202 and/or receiver 204. For example, processor 220 may control scanner 210 based on feedback signals from capacitance sensing, which will be described in greater detail below.

While scanner 210 is described as part of transmitter 202, it is understood that in some embodiments, receiver 204 may also include a scanner, e.g., before photodetector 216 in the light path. The scanner included in receiver 204 may be the same as or similar to scanner 210, and may operate in synchronization or in tandem with scanner 210. The inclusion of such a scanner in receiver 204 can improve the signal-to-noise ratio (SNR) and sensitivity of receiver 204. For example, photodetector 216 can capture light, e.g., returned laser beam 211 from desired directions, thereby avoiding interferences from other light sources, such as the sun and/or other LiDAR systems.

Figure 3A:
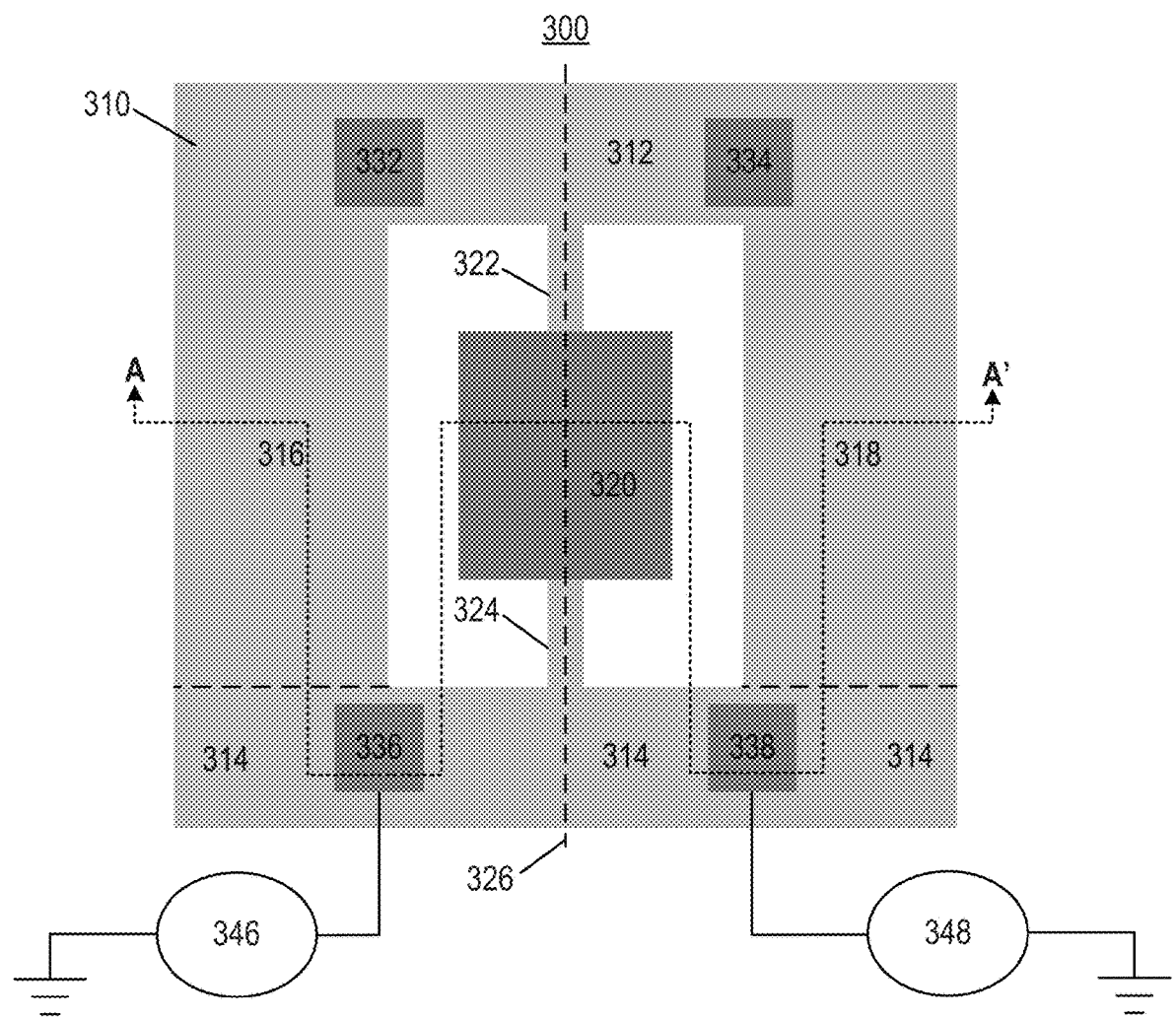
FIG. 3A illustrates a schematic diagram of an exemplary mirror assembly, according to embodiments of the disclosure.
Figure 3B:
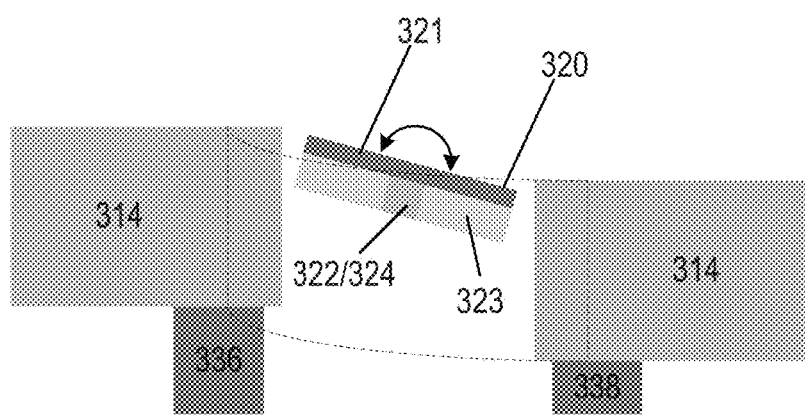
FIG. 3B illustrates a section view of the exemplary mirror assembly shown in FIG. 3A, according to embodiments of the disclosure.

FIG. 3A illustrates a schematic diagram of an exemplary mirror assembly 300 (top view), according to embodiments of the disclosure. FIG. 3B illustrates a section view of mirror assembly 300 along line A-A'. In the following passages, FIGS. 3A and 3B are discussed together.

As shown in FIG. 3A, mirror assembly 300 may include a frame 310. Frame 310 may be part of a substrate that is used as a base on which other components of mirror assembly 300 can be formed. The substrate/frame 310 may be made of semiconductor materials such as silicon (Si), insulator materials such as silicon dioxide ($SiO_2$), or a combination thereof.

Mirror assembly 300 may include a mirror 320 suspended over frame 310 by beams 322 and 324. Beams 322 and 324 may collectively referred to as a beam structure. Mirror 320 may be implemented by a single micro mirror and an array of micro mirrors. For simplicity, mirror 320 is also referred to as micro mirror 320. Beam 322 may be mechanically coupled to frame 310. Similarly, beam 324 may be mechanically coupled to frame 310. In some embodiments, frame 310, beams 322 and 324, and mirror 320 may couple to one another to form a single mechanical structure. Beams 322 and 324 may be rigidly coupled to frame 310. As used herein, rigid coupling refers to a fixed mechanical coupling such that relative motion or displacement between the two coupling components is not allowed. Beams 322 and 324 may also be referred to as springs, which may allow limited flexibility such that the suspended mirror 320 may tilt along a rotational axis 326 defined by beams 322 and 324. For example, referring to FIG. 3B, mirror 320 may title with respect to frame 310 back and forth in a clockwise and counterclockwise manner. The tilting motion of mirror 320 may be utilized to change the direction of an incident optical beam into multiple scanning directions.

As shown in FIG. 3A, frame 310 may include an upper arm 312, a lower arm 314, a left arm 316, and a right arm 318. It is noted that arms 312, 314, 316, and 318 may be part of a single-piece structure that forms frame 310. Designation of these arms may be used to indicate the spatial locations on frame 310, not necessarily referring to physically separate portions. Upper arm 312 and lower arm 314 may be perpendicular to rotational axis 326, while left arm 316 and right arm 318 may be parallel to rotational axis 326.

As shown in FIGS. 3A and 3B, arms 312, 314, 316, and 318 may enclose a center opening in which mirror 320 is suspended by beams 322 and 324. Mirror 320 may rotate (e.g., tilt) within the space of the opening along rotational axis 326. The rotational motion may be driven by a plurality of piezoelectric actuators, such as piezoelectric actuators 332, 334, 336, and 338 that are mechanically coupled to frame 310. As shown in FIG. 3A, each of these piezoelectric actuators may be disposed between rotational axis 326 and an outer edge of frame 310. In other words, these piezoelectric actuators may not extend beyond the outer boundaries of frame 310, and may not extend across rotational axis 326.

In some embodiments, these piezoelectric actuators may be disposed symmetrically with respect to rotational axis 326. For example, piezoelectric actuators 336 and 338 may form a pair of symmetrical actuators with respect to rotational axis 326. Similarly, piezoelectric actuators 332 and 334 may form another pair of symmetrical actuators with respect to rotational axis 326. Placing piezoelectric actuators symmetrically with respect to rotational axis 326 may improve the driving efficiency. Referring to FIG. 3B, symmetrical piezoelectric actuator pair 336 and 338 may be controlled to deform in an opposite manner: when one piezoelectric actuator (e.g., 336) expands, the other piezoelectric actuator (e.g., 338) contracts. Such a pattern of deformation would cause left arm 316 to rise while right arm 318 to sink, or vice versa, which in turn lead to a twisting force (torque) applied to beams 322 and 324 to rotate (e.g., tilt) mirror 320. By controlling the expansion and contraction of the symmetrical pair of piezoelectric actuators, high efficiency energy transfer from the actuators to mirror 320 may be achieved.

As shown in FIG. 3A, the four piezoelectric actuators may be disposed in proximity to four corners of the central opening. Take piezoelectric actuator 336 for example, the entire area of coupling between piezoelectric actuator 336 and frame 310 may be within lower arm 314 (assume that lower arm 314 extends toward the left and right edges of frame 310), while the right edge of piezoelectric actuator 336 is closer to rotational axis 326 than the right edge of left arm 316. The other piezoelectric actuators 338, 332, and 334 may be similarly arranged. In this way, these piezoelectric actuators can be placed closer to rotational axis 326 than when they are coupled to left/right arms (316 and 318). This "four-corner" placement can be used for relatively large mirrors, such as mirrors larger than about 500 μm in size. For smaller mirrors (e.g., less than about 500 μm in size), the placement shown in FIGS. 4A and 4B can be used, which will be described in greater detail later.

The placement of the plurality of piezoelectric actuators can also be quantified using the distance between a piezoelectric actuator and rotational axis 326. For example, as shown in FIGS. 3A and 3B, the distance between each of the piezoelectric actuators 332-336 (measured from the closest edge of the respective piezoelectric actuators) and rotational axis 326 is less than one half of the upper edge of the central opening along upper arm 312 (or the lower edge along lower arm 314). In some embodiments, an optimal distance may be calculated to achieve a maximal torque applied to mirror 320. The optimal distance may then be used as a predetermined distance in the placement of the piezoelectric actuators.

The optimal distance may be calculated based on optimization of the stroke (e.g., degree of deformation) of the piezoelectric actuators and the torque applied to frame 310. The stroke with no load ($x_{FL}$) of a piezoelectric actuator is proportional to the blocking force ($F_B$) and can be expressed as $$x_{FL} = \frac{F_B}{K_A},$$

where $K_A$ is the actuator stiffness. When a load is applied to the actuator the stroke changes as function of the blocking force and it can be expressed as $$x = x_{FL}\left(\frac{K_A}{K_L + K_A}\right),$$

where $K_L$ is the frame stiffness and it can be simplified as an anchored beam and expressed as $$K_L \sim \frac{3EI}{L^3},$$

where E is the elastic modules, I is the second moment of area, and L is the length of the beam or in this case the position of the piezoelectric actuator. The final stroke can be expressed as $$x = x_{FL}\left(\frac{L^3 K_A}{3EI + L^3 K_A}\right).$$

Figure 5A:
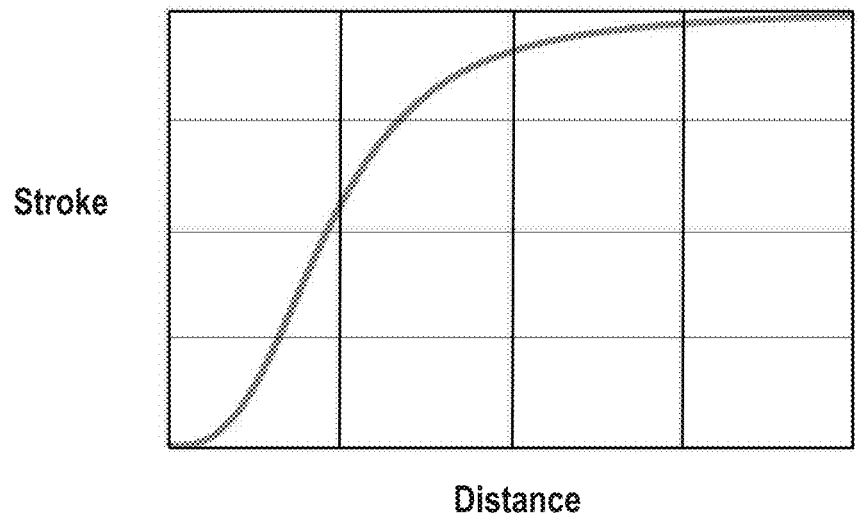
FIG. 5A illustrate an exemplary curve showing the relationship between piezoelectric actuator position and stroke, according to embodiments of the disclosure.

FIG. 5A is an exemplary curve showing the relationship between distance and stroke. As shown in FIG. 5A, when the piezoelectric actuator is located near the rotational axis (e.g., shorter distance), the stroke is drastically reduced.

On the other hand, the torque applied to frame 310, which is proportional to the mirror angle, can be expressed as $$\tau \sim K_L x L = \frac{3EIx}{L^2}.$$

Figure 5B:
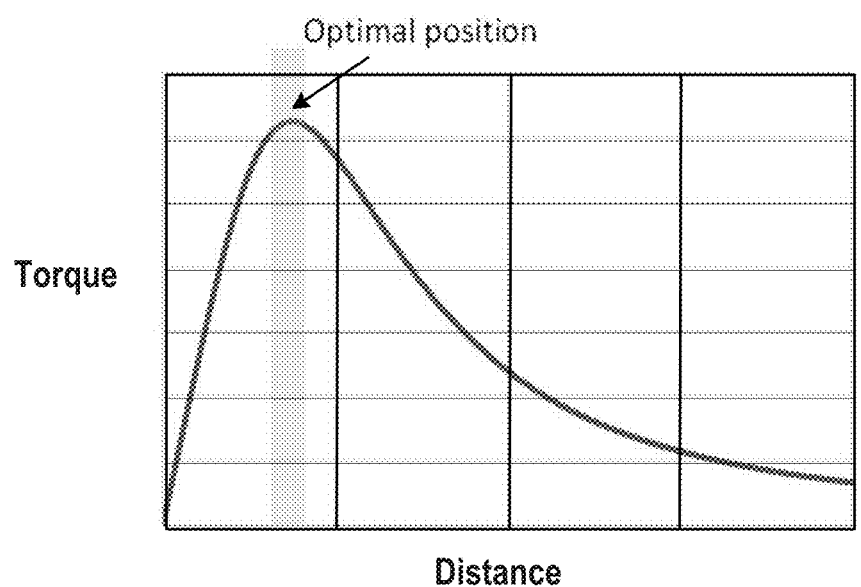
FIG. 5B illustrate an exemplary curve showing the relationship between piezoelectric actuator position and torque, according to embodiments of the disclosure.

If the piezoelectric actuator is placed far away from the rotational axis, the torque reduces drastically, as depicted in FIG. 5B, which is an exemplary curve showing the relationship between distance and torque. Thus, the optimal position of the actuators may be determined to be where the maximal torque is achieved, as indicated in FIG. 5B. At this distance, the maximal oscillation angle can be obtained.

In some embodiments, multiple piezoelectric actuators may be individually driven by their respective driving signals. Returning to FIG. 3A, piezoelectric actuator 336 may be driven by a driving source 346 that outputs a first driving signal, while piezoelectric actuator 338 may be driven by another driving source 348 that outputs a second driving signal. The first and second driving signals may have a phase shift, for example, 180 degrees, to maximize the torsional motion. Similarly, piezoelectric actuators 332 and 334 may also be driven by their respective driving sources.

As shown in FIG. 3B, mirror 320 may include a reflective layer 321 and a supporting layer 323. Support layer 323 may be made of the same material as beams 322/324. For example, support layer 323 may be formed together with beams 322/324. Reflective layer 321 may include a high-reflection material to reflect optical signals.

Figure 4A:
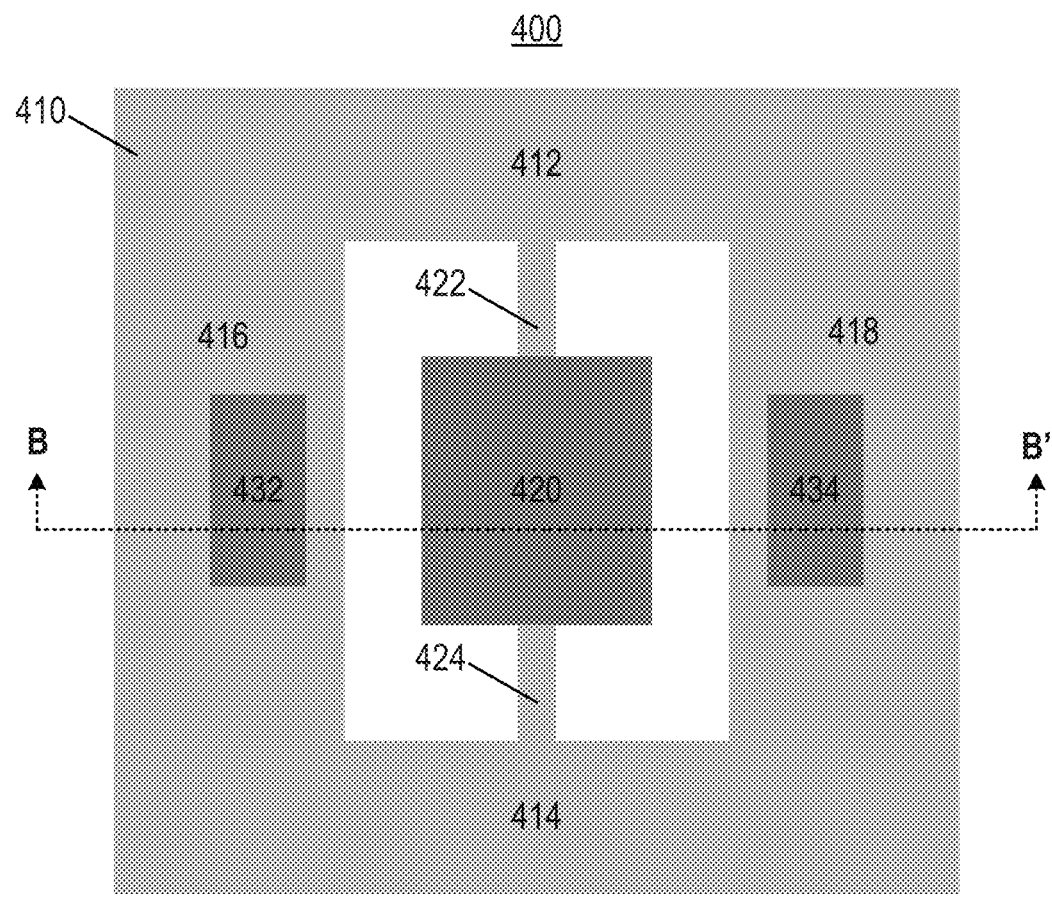
FIG. 4A illustrates a schematic diagram of another exemplary mirror assembly, according to embodiments of the disclosure.
Figure 4B:
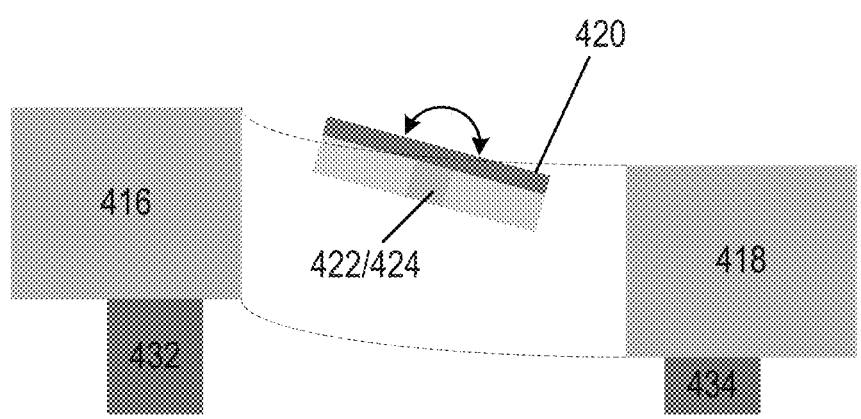
FIG. 4B illustrates a section view of the exemplary mirror assembly shown in FIG. 4A, according to embodiments of the disclosure.

FIGS. 4A and 4B illustrate another exemplary mirror assembly 400 in which two piezoelectric actuators 432 and 434 are mechanically coupled with left arm 416 and right arm 418, respectively. Other components of mirror assembly 400 may be similar to mirror assembly 300, including a frame 410, beams 422 and 424, and mirror 420. Similar to frame 310, frame 410 may include upper arm 412, lower arm 414, left arm 416, and right arm 418. FIG. 4B illustrates a section view of mirror assembly 400 along line B-B', showing piezoelectric actuator 432 is expanding while piezoelectric actuator 434 is contracting, similar to FIG. 3B except the placement of piezoelectric actuators 432 and 434.

Figure 6:
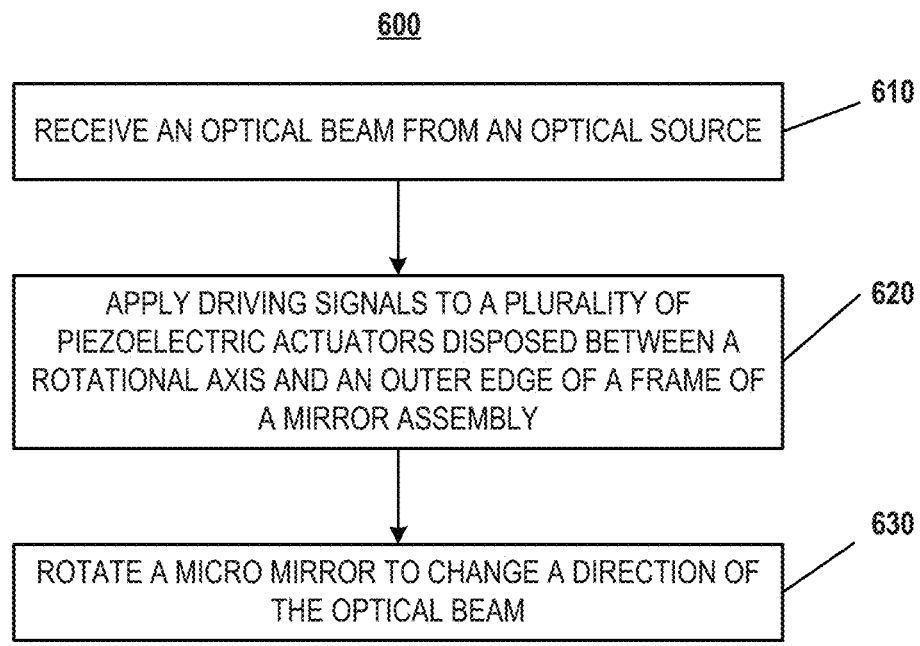
FIG. 6 illustrates a flow chart of an exemplary method for controlling a mirror assembly, according to embodiments of the disclosure.

FIG. 6 illustrates a flow chart of an exemplary method 600 for controlling a mirror assembly (e.g., mirror assembly 300 or 400) in an optical sensing system (e.g., LiDAR system 102), according to embodiments of the disclosure. Method 600 may include multiple steps. It is to be appreciated that some of the steps may be omitted to perform method 600. Further, some of the steps may be performed simultaneously, or in a different order than shown in FIG. 6.

In step 610, a micro mirror (e.g., mirror 320) may receive an optical beam (e.g., laser beam 207) emitted from an optical source (e.g., optical source 206). For example, optical source 206 may be controlled by processor 220 to emit laser beam 207 (e.g., a pulsed laser beam), which may travel toward mirror 320 of mirror assembly 300, which may be part of scanner 210. Mirror 320 may receive laser beam 207 and change the direction of laser beam 207 to scan an environment around optical sensing system 102.

In step 620, a plurality of piezoelectric actuators (e.g., 332-338) may be individually driven by their respective driving sources (e.g., 346, 348) to generate periodic deformation for rotating mirror 320. The driving sources may output driving signals that have a phase shift among one another to maximize torque generated by the piezoelectric actuators. The plurality of piezoelectric actuators may be placed between a rotational axis (e.g., 326) and an outer edge of a frame (e.g., 310) of the mirror assembly (e.g., 300). The plurality of piezoelectric actuators may be disposed symmetrically with respect to the rotational axis. The distance between each piezoelectric actuator and the rotational axis may be set to yield maximal torque applied to mirror 320.

In step 630, the plurality of piezoelectric actuators may tilt mirror 320 with respect to frame 310 to change the direction of laser beam 207 (e.g., becoming laser beam 209) to scan the environment. For example, piezoelectric actuators may expand or contract at different locations of frame 310, thereby generating a torque tilting mirror 320 along rotational axis 326. The driving signals may be AC signals having a phase shift among one another (e.g., having opposite polarities for a pair of symmetrical piezoelectric actuators). The frequency of the AC signals may be set to be or close to the resonant frequency of mirror 320 to achieve the maximum tilting range.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. A mirror assembly for controlling optical directions in an optical sensing system, the mirror assembly comprising:
a frame;
a beam structure mechanically coupled to the frame, the beam structure defining a rotational axis;
a micro mirror suspended by the beam structure; and
a plurality of piezoelectric actuators mechanically coupled to the frame and configured to rotate the micro mirror along the rotational axis, wherein each of the plurality of piezoelectric actuators is disposed between the rotational axis and an outer edge of the frame;
wherein the plurality of piezoelectric actuators are disposed away from the rotational axis at a predetermined distance to achieve a maximal torque applied to the micro mirror.

2. The mirror assembly of claim 1, wherein the plurality of the piezoelectric actuators are disposed symmetrically with respect to the rotational axis.

3. The mirror assembly of claim 1, wherein:
the frame comprises an upper arm, a lower arm, a left arm, and a right arm that enclose a center opening in which the micro mirror is suspended by the beam structure;
the upper arm and the lower arm are perpendicular to the rotational axis; and
the left arm and right arm are parallel to the rotational axis.

4. The mirror assembly of claim 3, wherein the plurality of piezoelectric actuators comprise two piezoelectric actuators mechanically coupled to the left arm and the right arm, respectively.

5. The mirror assembly of claim 3, wherein the plurality of piezoelectric actuators comprise four piezoelectric actuators disposed in proximity to four corners of the central opening.

6. The mirror assembly of claim 3, wherein the plurality of piezoelectric actuators comprise:
two upper piezoelectric actuators mechanically coupled to the upper arm of the frame; and
two lower piezoelectric actuators mechanically coupled to the lower arm of the frame.

7. The mirror assembly of claim 3, wherein a distance between each of the plurality of piezoelectric actuators and the rotational axis is less than one half of an edge of the central opening along the upper or lower arm.

8. The mirror assembly of claim 1, wherein the plurality of piezoelectric actuators are configured to rotate the micro mirror along the rotational axis by causing periodic deformation of the frame in response to respective driving signals.

9. The mirror assembly of claim 1, wherein at least two of the plurality of piezoelectric actuators are individually driven by first and second driving signals, respectively, wherein the first and second driving signals have a phase shift.

10. A method for controlling a mirror assembly in an optical sensing system, the method comprising:
receiving, by a micro mirror of the mirror assembly, an optical beam emitted from an optical source, wherein the micro mirror is suspended by a beam structure mechanically coupled to a frame of the mirror assembly; and
rotating, by a plurality of piezoelectric actuators mechanically coupled to the frame, the micro mirror along a rotational axis defined by the beam structure to change a direction of the optical beam, wherein each of the plurality of piezoelectric actuators is disposed between the rotational axis and an outer edge of the frame, and the plurality of piezoelectric actuators are disposed away from the rotational axis at a predetermined distance to achieve a maximal torque applied to the micro mirror.

11. The method of claim 10, wherein:
the frame comprises a central opening in which the micro mirror is suspended by the beam structure; and
a distance between each of the plurality of piezoelectric actuators and the rotational axis is less than one half of an edge of the central opening.

12. The method of claim 10, comprising:
applying a driving signal to each of the plurality of piezoelectric actuators, wherein the plurality of the piezoelectric actuators are disposed symmetrically with respect to the rotational axis and driving signals applied to a pair of piezoelectric actuators symmetrical to each other have a phase shift.

13. The method of claim 10, comprising:
individually driving at least two of the plurality of piezoelectric actuators using first and second driving signals, respectively, wherein the first and second driving signals have a phase shift.

14. An optical sensing system, comprising:
an optical source configured to emit an optical beam to scan an environment around the optical sensing system; and
a mirror assembly configured to control a direction of the optical beam, the mirror assembly comprising:
a frame;
a beam structure mechanically coupled to the frame, the beam structure defining a rotational axis;
a micro mirror suspended by the beam structure; and
a plurality of piezoelectric actuators mechanically coupled to the frame and configured to rotate the micro mirror along the rotational axis, wherein each of the plurality of piezoelectric actuators is disposed between the rotational axis and an outer edge of the frame,
wherein the plurality of piezoelectric actuators are disposed away from the rotational axis at a predetermined distance to achieve a maximal torque applied to the micro mirror.

15. The optical sensing system of claim 14, wherein the plurality of the piezoelectric actuators are disposed symmetrically with respect to the rotational axis.

16. The optical sensing system of claim 14, wherein:
the frame comprises an upper arm, a lower arm, a left arm, and a right arm that enclose a center opening in which the micro mirror is suspended by the beam structure;
the upper arm and the lower arm are perpendicular to the rotational axis; and
the left arm and right arm are parallel to the rotational axis.

17. The optical sensing system of claim 16, wherein the plurality of piezoelectric actuators comprise two piezoelectric actuators mechanically coupled to the left arm and the right arm, respectively.

18. The optical sensing system of claim 16, wherein the plurality of piezoelectric actuators comprise:
two upper piezoelectric actuators mechanically coupled to the upper arm of the frame; and
two lower piezoelectric actuators mechanically coupled to the lower arm of the frame.

* * * * *